(12) United States Patent
Xu et al.

(10) Patent No.: US 11,112,528 B2
(45) Date of Patent: Sep. 7, 2021

(54) MULTI-ENERGY-SPECTRUM X-RAY IMAGING SYSTEM AND METHOD OF SUBSTANCE IDENTIFICATION OF ITEM TO BE INSPECTED BY USING THE SAME

(71) Applicant: Nuctech Company Limited, Beijing (CN)

(72) Inventors: Guangming Xu, Beijing (CN); Bicheng Liu, Beijing (CN); Ziran Zhao, Beijing (CN); Jianping Gu, Beijing (CN); Qiang Li, Beijing (CN); Lan Zhang, Beijing (CN)

(73) Assignee: NUCTECH COMPANY LIMITED, Beijing (CN)

( * ) Notice: Subject to any disclaimer, the term of this patent is extended or adjusted under 35 U.S.C. 154(b) by 334 days.

(21) Appl. No.: 16/314,093

(22) PCT Filed: Sep. 12, 2017

(86) PCT No.: PCT/CN2017/101363
§ 371 (c)(1),
(2) Date: Dec. 28, 2018

(87) PCT Pub. No.: WO2018/103398
PCT Pub. Date: Jun. 14, 2018

(65) Prior Publication Data
US 2020/0309987 A1    Oct. 1, 2020

(30) Foreign Application Priority Data

Dec. 7, 2016  (CN) .......................... 201611120598.3
Dec. 7, 2016  (CN) .......................... 201611159090.4
Dec. 7, 2016  (CN) .......................... 201611159161.0

(51) Int. Cl.
*G01V 5/00* (2006.01)
*G01N 23/087* (2018.01)
*G01R 23/18* (2006.01)

(52) U.S. Cl.
CPC ......... *G01V 5/0041* (2013.01); *G01N 23/087* (2013.01); *G01R 23/18* (2013.01)

(58) Field of Classification Search
CPC .............. G01V 5/0041; G01N 23/087; G01N 2223/405; G01N 23/10; G01N 2223/423;
(Continued)

(56) References Cited

U.S. PATENT DOCUMENTS 3,478,209 A * 11/1969 Irving ...................... G21H 3/02
250/467.1
2009/0087055 A1    4/2009 Maltz
(Continued)

FOREIGN PATENT DOCUMENTS

CN    102753963 A    10/2012
CN    103069305 A    4/2013
(Continued)

OTHER PUBLICATIONS

International Search Report and Written Opinion of the International Searching Authority for International Patent Application No. PCT/CN2017/101363 dated Dec. 14, 2017, 10 pages.

*Primary Examiner* — David P Porta
*Assistant Examiner* — Gisselle M Gutierrez
(74) *Attorney, Agent, or Firm* — Merchant & Gould P.C.

(57) ABSTRACT

The present disclosure discloses a method of substance identification of an item to be inspected using a multi-energy-spectrum X-ray imaging system, the method comprising: acquiring a transparency related vector consisting of transparency values of the item to be inspected in N energy regions, wherein N is greater than 2; calculating distances between the transparency related vector and transparency related vectors stored in the system consisting of N transparency mean values of multiple kinds of items with multiple thicknesses in the N energy regions; and identifying the item to be inspected as the item corresponding to the minimum distance. The present disclosure is based on a multi-energy-spectrum X-ray imaging system, and proposes a method of substance identification by analyzing the multi-energy-spectrum substance identification issue. Compared with the conventional dual-energy X-ray system, the multi-spectrum imaging can significantly improve the system's ability to identify substances in theory, especially in the field of security applications. The improvement of substance identification is important for contraband inspection, such as, drugs, explosives.

12 Claims, 7 Drawing Sheets

(58) Field of Classification Search
CPC ........... G01N 2223/1016; G01N 23/04; G01N 2223/03; G01R 23/18
USPC ......................................................... 378/57
See application file for complete search history.

(56) References Cited

U.S. PATENT DOCUMENTS

| | | | |
|---|---|---|---|
| 2010/0111260 A1* | 5/2010 | Motz ....................... | H01J 35/16 378/144 |
| 2013/0079918 A1* | 3/2013 | Spencer ................. | G01N 23/02 700/223 |
| 2018/0209922 A1* | 7/2018 | Yamakawa ............ | G01N 23/04 |

FOREIGN PATENT DOCUMENTS

| | | |
|---|---|---|
| CN | 105628718 A | 6/2016 |
| WO | 2013/001247 A1 | 1/2013 |
| WO | 2015/091083 A1 | 6/2015 |

\* cited by examiner

MULTI-ENERGY-SPECTRUM X-RAY IMAGING SYSTEM AND METHOD OF SUBSTANCE IDENTIFICATION OF ITEM TO BE INSPECTED BY USING THE SAME

CROSS-REFERENCE TO RELATED APPLICATION(S)

This application is a National Stage Application of PCT/CN2017/101363, filed on Sep. 12, 2017, which claims priority to the Chinese Patent Application No. 201611120598.3, filed on Dec. 7, 2016, entitled "MULTI-ENERGY-SPECTRUM X-RAY IMAGING SYSTEM AND METHOD OF SUBSTANCE IDENTIFICATION OF ITEM TO BE INSPECTED BY USING THE SAME," the Chinese Patent Application No. 201611159161.0, filed on Dec. 7, 2016, entitled "MULTI-ENERGY-SPECTRUM X-RAY IMAGING SYSTEM AND METHOD OF SUBSTANCE IDENTIFICATION OF ITEM TO BE INSPECTED BY USING THE SAME," and the Chinese Patent Application No. 201611159090.4, filed on Dec. 7, 2016, entitled "MULTI-ENERGY-SPECTRUM X-RAY IMAGING SYSTEM AND METHOD OF SUBSTANCE IDENTIFICATION OF ITEM TO BE INSPECTED BY USING THE SAME," which are incorporated herein by reference in their entireties. A claim of priority is made to each of the above disclosed applications.

TECHNICAL FIELD

The present disclosure generally relates to the field of radiation imaging, and in particular, to a multi-energy-spectrum X-ray imaging system and a method of substance identification of an item to be inspected by using the same.

BACKGROUND

The X-ray transmission imaging technology is widely used in the fields of security, medical, etc. The substance identification ability of an imaging system is an important criterion for measuring performance of such a system.

According to the X-ray transmission imaging principle, the most basic formula is $I=I_0 e^{-\mu t}$, i.e. the intensity of a single-energy X-ray beam is attenuated with the exponential function of the thickness of the absorbing substance, where $I_0$ is the ray intensity before the attenuation, I is the ray intensity after the attenuation by a material with a certain thickness, t is the mass thickness of the material; and $\mu$ represents the mass attenuation coefficient, and characterizes the material properties of the substance. The transparency value $T=I/I_0=e^{-\mu t}$ is theoretically between 0 and 1, where $I_0$ can typically be acquired by scanning the air image. The $\alpha$ value is defined as $\alpha = \ln T = \mu t$.

At present, the dual energy imaging equipment widely used in the security field adopts two X-rays with different energy spectrums which penetrate items to be inspected. By using a difference between two transparency values, equivalent atomic number information of material of the item to be inspected can be obtained to a certain extent. However, due to a large overlap between the two energy spectrums of the dual-energy X-ray, the ability of substance identification of the dual-energy system is limited objectively.

By using a photon counting detector with a certain energy spectrum identification ability, the multi-energy-spectrum imaging may divide the X-ray with a broad energy spectrum distribution into several different energy regions $[E_i^{min}, E_i^{max}]$, and then count the photons and perform imaging in each energy region, respectively. In recent years, with the CZT and other photon counting detector technology continue to develop, the multi-energy-spectrum imaging technology is also becoming more mature. Because the multi-energy-spectrum X-ray imaging technology has significant advantages in reducing the radiation dose and improving the ability of substance identification, it has a broader application prospect in the field of security and medical. Compared with the conventional dual-energy imaging, the multi-energy-spectrum imaging substantially eliminates the overlap between the energy spectrums and achieve better energy discrimination between different energy spectrums while an energy spectrum can be divided into more energy regions as required (as shown in FIG. 1), thereby providing the preconditions for introducing more energy information.

At present, the research on multi-energy-spectrum substance identification methods is as follows.

For the multi-energy-spectrum CT imaging, the distribution of the attenuation coefficients $\mu_i$ is calculated based on the projection data of the different energy regions of the X-ray energy spectrum, and in turn an atomic number Z which is closest to that for the distribution is found by the method of curve approximation to realize the substance classification.

An expression of a Gaussian probability density of multidimensional eigenspace with a number of variables of N is provided, as shown in the following equation (1), where $\Sigma_{ij}$ is a covariance matrix of a material $Z_i$ with a thickness of $t_j$, the vector $\mu_{ij}$ corresponds to the mean vector of the $\alpha$ value obtained by using the calibration material:

$$f_{ij}(\vec{\alpha}) = \frac{1}{(2\pi)^{\frac{N}{2}} \cdot \sqrt{|\Sigma|_{ij}}} \cdot e^{-\frac{1}{2}(\vec{\alpha}-\vec{\mu}_{ij})^T \cdot \Sigma_{ij}^{-1} \cdot (\vec{\alpha}-\vec{\mu}_{ij})} \quad (1)$$

The solution firstly obtains the eigen mean vector and the covariance matrix by scanning the calibration materials with different thicknesses, then the Gaussian probability density expression is used to calculate the probability that the material to be inspected belongs to each category, and the material classification is realized according to the maximum probability principle. A similar technical solution can also be found in the article by CEA-Leti, a French research institution.

MultiX proposes to construct a likelihood function based on Poisson statistics of photon counting and realizes the method of substance identification by comparing the likelihood value of the item to be inspected and the likelihood values of the calibration materials one by one. CEA-Leti finds, in its another article for the multi-energy-spectrum backscatter imaging problem, that the slope value $D\mu'$ of the mass attenuation coefficient curve of several common organic materials in the low energy regions and their atomic numbers Z have a substantially linear relationship, and therefore it is proposed that the substance can be identified by calculating the $D\mu'$ of the item to be inspected.

At present, there are some basic studies on methods for multi-energy-spectrum substance identification, but most of them are only classification calculations based on some statistical distribution assumption; and some methods are still empirical methods, which can be improved. We have a more in-depth analysis of the multi-energy-spectrum substance identification problems.

The multi-energy-spectrum imaging system divides the energy spectrum of the received ray into several energy regions and counts respectively, wherein $T_i$ or $\alpha_i = -\ln T_i = \mu_i t$ is calculated for each of the energy regions (i=1 . . . N), where N is a number of energy regions. Assuming that the X-ray has single energy E, a mass attenuation coefficient $\mu(Z, E)$ is a function of an atomic number Z and energy E. According to the data published by the National Institute of Standards and Technology (NIST), $\mu(Z, E)$ can be obtained by looking it up in a table. For the X-ray with a certain energy spectrum distribution p(E) and mean energy $\overline{E}$, its low-energy components have a greater degree of attenuation after the attenuation by a certain material with a certain thickness, such that the mean energy $\overline{E}$ of the energy spectrum is also changed, which is known as the X-ray hardening effect.

Under an extreme condition where the energy spectrum is divided into very narrow energy regions, the hardening effect of each energy region is negligible, and $\mu(Z, E)$ is independent of the thickness of the material. In practice, there is still a certain energy spectrum distribution in each discrete energy region, especially if the divided energy regions are wide, in which case the hardening effect of the ray cannot be neglected. The mean energy E of the energy region is related to the mass thickness t of the material, and $\mu(Z, E)$ is also changed with t. In the X-ray energy range of interest and the atomic number range of the common materials, it can be considered that the continuous Z and mass thickness t make $\mu(Z, E)$ continuous, and then the eigen mean value $T_i$ or $\alpha_i$ of the different mass thickness t and equivalent atomic numbers Z form a two-dimensional surface f (Z, t) in the corresponding multidimensional eigenspace.

f (Z, t) can be obtained in two ways, one of which is to look $\mu$ (Z, E) up in the NIST data for the known energy spectrum distribution p(E), and traverse a variety of materials according to $\Sigma N(E) = \Sigma N_0(E) e^{-\mu(Z,E) \cdot t}$ and $T = \Sigma N(E) / \Sigma N_0 (E)$ to calculate f(Z, t). Another way is to collect data for calibration material step blocks with a variety of different thickness and atomic numbers through an actual scanning process, and to acquire f(Z, t) by fitting or interpolation, as shown in FIG. 2. In FIG. 2, $T_1$, $T_2$, and $T_3$ represent distributions of the transparency values of the corresponding calibration materials in three energy regions, respectively.

The key for the multi-energy-spectrum substance identification is to calculate the projection position of the eigenvalue of the item to be inspected on the surface f (Z, t) in the multidimensional eigenspace. However, it is very difficult to calculate the projection directly due to the complexity of the mathematical expression of f (Z, t).

SUMMARY

In view of the above, the present disclosure proposes a multi-energy-spectrum X-ray imaging system and a method of substance identification of an item to be inspected by using the same.

According to a first aspect of the present disclosure, there is proposed a method of substance identification of an item to be inspected using a multi-energy-spectrum X-ray imaging system, the method comprising:

acquiring a transparency related vector consisting of transparency values of the item to be inspected in N energy regions, wherein N is greater than 2; and determining the item to be inspected based on the transparency related vector.

In some embodiments, the determining the item to be inspected based on the transparency related vector comprises:

calculating distances between the transparency related vector and transparency related vectors stored in the system consisting of N transparency mean values of multiple kinds of items with multiple thicknesses in the N energy regions; and identifying the item to be inspected as the item corresponding to the minimum distance.

In some embodiments, the calculating distances between the transparency related vector and transparency related vectors stored in the system consisting of N transparency mean values of multiple kinds of items with multiple thicknesses in the N energy regions comprises:

calculating the distance by using the Mahalanobis distance algorithm, the Euclidean distance algorithm, or the Cosine distance algorithm.

In some embodiments, the determining the item to be inspected based on the transparency related vector comprises:

calculating distances between the transparency related vector and transparency related vectors stored in the system consisting of N transparency mean values of multiple kinds of items with multiple thicknesses in the N energy regions; and determining a first atomic number and a first thickness of the item corresponding to the minimum distance and a second atomic number and a second thickness of an item corresponding to the next minimum distance;

determining an atomic number and a thickness of the item to be inspected by using a linear interpolation algorithm based on the first and second atomic numbers and the first and second thicknesses; and determining a kind of the item to be inspected based on the atomic number and the thickness of the item to be inspected.

In some embodiments, the linear interpolation algorithm is a one-dimensional linear interpolation algorithm when the first atomic number is same as the second atomic number and the first thickness is different from the second thickness.

In some embodiments, the linear interpolation algorithm is a two-dimensional linear interpolation algorithm when the first atomic number is different from the second atomic number and the first thickness is different from the second thickness.

In some embodiments, the linear interpolation algorithm is a one-dimensional linear interpolation algorithm when the first atomic number is different from the second atomic number and the first thickness is same as the second thickness.

In some embodiments, the determining the item to be inspected based on the transparency related vector comprises:

mapping the transparency related vector and transparency related vectors stored in the system consisting of N transparency mean values of multiple kinds of items with multiple thicknesses in the N energy regions into a two-dimensional plane by using a non-linear dimension reduction algorithm, so as to acquire a mapping point of the transparency related vector of the item to be inspected in the two-dimensional plane and a set of mapping points of the transparency related vectors of the multiple kinds of items in the two-dimensional plane, respectively;

determining one of the set of mapping points which is closest to the mapping point; and identifying the item to be inspected as the one of the multiple kinds of items corresponding to the closest point.

In some embodiments, the non-linear dimension reduction algorithm comprises the isometric mapping (Isomap)

algorithm, the local linear embedded (LLE) algorithm, and the multi-dimensional scaling (MDS) algorithm.

In some embodiments, the determining one of the set of mapping points which is closest to the mapping point comprises:

determining a point which is closest to the mapping point by using the Mahalanobis distance algorithm, the Euclidean distance algorithm, or the Cosine distance algorithm.

In some embodiments, the multiple kinds of items comprise explosives.

In some embodiments, the determining the item to be inspected based on the transparency related vector comprises:

selecting one or more of the N energy regions as reference energy regions;

acquiring respective N transparency values of the item to be inspected in the N energy regions based on the transparency related vector;

calculating a reference transparency value based on the transparency values of the item to be inspected in the one or more energy regions which are selected as the reference regions;

calculating a relative mass attenuation coefficient value of the item to be inspected in the N energy regions based on the reference transparency value and the N transparency values;

determining one of the multiple kinds of items having a relative mass attenuation coefficient value closest to the relative mass attenuation coefficient value, and identifying the item to be inspected as the determined item.

In some embodiments, the selecting one or more of the N energy regions as reference energy regions comprises:

selecting all of the N energy regions as the reference energy regions.

In some embodiments, the selecting one or more of the N energy regions as reference energy regions comprises:

selecting any one of the N energy regions as the reference energy region.

In some embodiments, the determining one of the multiple kinds of items having a relative mass attenuation coefficient value closest to the relative mass attenuation coefficient value, and identifying the item to be inspected as the determined item comprises:

determining one of the multiple kinds of items having a relative mass attenuation coefficient value closest to the relative mass attenuation coefficient value by using the minimum mean square error method.

In some embodiments, the determining one of the multiple kinds of items having a relative mass attenuation coefficient value closest to the relative mass attenuation coefficient value, and identifying the item to be inspected as the determined item comprises:

determining one of the multiple kinds of items having a relative mass attenuation coefficient value closest to the relative mass attenuation coefficient value by minimizing $\chi^2$ determined according to:

$$\chi^2 = \sum_{i=1}^{N} \frac{(R_i^m - R^{\omega_i})^2}{R^{\omega_i}}, i = 1 \ldots N$$

Where $R_I^m$ is the relative mass attenuation coefficient value of the item to be inspected m in the $i^{th}$ energy region, and $R^{\omega_i}$ is the relative mass attenuation coefficient value of one of the multiple kinds of items $\omega_i$ in the $i^{th}$ energy region.

According to a second aspect of the present disclosure, there is proposed a multi-energy-spectrum X-ray imaging system is disclosed, the system comprising:

an X-ray source configured to generate an X-ray;

a detector configured to receive the X-ray which is emitted from the X-ray source and is transmitted through or scattered by an item to be inspected and convert the received X-ray into an output signal;

a processor configured to execute program instructions to be operable to acquire, based on the output signal, a transparency related vector consisting of transparency values of the item to be inspected in N energy regions, wherein N is greater than 2; and determine the item to be inspected based on the transparency related vector; and a memory configured to store the program instructions.

In some embodiments, the processor is further configured to determine the item to be inspected based on the transparency related vector by:

calculating distances between the transparency related vector and transparency related vectors stored in the system consisting of N transparency mean values of multiple kinds of items with multiple thicknesses in the N energy regions; and identifying the item to be inspected as the item corresponding to the minimum distance.

In some embodiments, the processor is further configured to:

calculate distances between the transparency related vector and transparency related vectors stored in the system consisting of N transparency mean values of multiple kinds of items with multiple thicknesses in the N energy regions by using the Mahalanobis distance algorithm, the Euclidean distance algorithm, or the Cosine distance algorithm.

In some embodiments, the processor is further configured to determine the item to be inspected based on the transparency related vector by:

calculating distances between the transparency related vector and transparency related vectors stored in the system consisting of N transparency mean values of multiple kinds of items with multiple thicknesses in the N energy regions; and determining a first atomic number and a first thickness of the item corresponding to the minimum distance and a second atomic number and a second thickness of an item corresponding to the next minimum distance;

determining an atomic number and a thickness of the item to be inspected by using a linear interpolation algorithm based on the first and second atomic numbers and the first and second thicknesses; and determining a kind of the item to be inspected based on the atomic number and the thickness of the item to be inspected.

In some embodiments, the linear interpolation algorithm is a one-dimensional linear interpolation algorithm when the first atomic number is same as the second atomic number and the first thickness is different from the second thickness.

In some embodiments, the linear interpolation algorithm is a two-dimensional linear interpolation algorithm when the first atomic number is different from the second atomic number and the first thickness is different from the second thickness.

In some embodiments, the linear interpolation algorithm is a one-dimensional linear interpolation algorithm when the first atomic number is different from the second atomic number and the first thickness is same as the second thickness.

In some embodiments, the processor is further configured to determine the item to be inspected based on the transparency related vector by:

mapping the transparency related vector and transparency related vectors stored in the system consisting of N transparency mean values of multiple kinds of items with multiple thicknesses in the N energy regions into a two-dimensional plane by using a non-linear dimension reduction algorithm, so as to acquire a mapping point of the transparency related vector of the item to be inspected in the two-dimensional plane and a set of mapping points of the transparency related vectors of the multiple kinds of items in the two-dimensional plane, respectively;

determining one of the set of mapping points which is closest to the mapping point; and identifying the item to be inspected as the one of the multiple kinds of items corresponding to the closest point.

In some embodiments, the non-linear dimension reduction algorithm comprises the isometric mapping (Isomap) algorithm, the local linear embedded (LLE) algorithm, and the multi-dimensional scaling (MDS) algorithm.

In some embodiments, the processor is further configured to determine a point of the set of mapping points which is closest to the mapping point by using the Mahalanobis distance algorithm, the Euclidean distance algorithm, or the Cosine distance algorithm.

In some embodiments, the multiple kinds of items comprise explosives.

In some embodiments, the processor is further configured to determine the item to be inspected based on the transparency related vector by:

selecting one or more of the N energy regions as reference energy regions;

acquiring respective N transparency values of the item to be inspected in the N energy regions;

calculating a reference transparency value based on the transparency values of the item to be inspected in the one or more energy regions which are selected as the reference regions;

calculating a relative mass attenuation coefficient value of the item to be inspected in the N energy regions based on the reference transparency value and the N transparency values;

determining one of the multiple kinds of items having a relative mass attenuation coefficient value closest to the relative mass attenuation coefficient value, and identifying the item to be inspected as the determined item; and In some embodiments, the processor is further configured to select one or more of the N energy regions as reference energy regions by:

selecting all of the N energy regions as the reference energy regions.

In some embodiments, the processor is further configured to select one or more of the N energy regions as reference energy regions by:

selecting any one of the N energy regions as the reference energy region.

In some embodiments, the processor is further configured to:

determining one of the multiple kinds of items having a relative mass attenuation coefficient value closest to the relative mass attenuation coefficient value by using the minimum mean square error method.

In some embodiments, the processor is further configured to:

determining one of the multiple kinds of items having a relative mass attenuation coefficient value closest to the relative mass attenuation coefficient value by minimizing $\chi^2$ determined according to:

$$\chi^2 = \sum_{i=1}^{N} \frac{(R_i^m - R^{\omega_i})^2}{R^{\omega_i}}, i = 1 \ldots N$$

Where $R_I^m$ is the relative mass attenuation coefficient value of the item to be inspected m in the $i^{th}$ energy region, $R^{\omega_i}$ is the relative mass attenuation coefficient value of one of the multiple kinds of items $\omega_i$ in the $i^{th}$ energy region.

According to a third aspect of the present disclosure, there is proposed a computer readable medium is disclosed, comprising instructions which, when executed by a processor, performs the method according to the first aspect.

By using a photon counting detector with a certain energy spectrum identification ability, the multi-energy-spectrum imaging may divide the received X-ray spectrum into multiple energy regions, and perform counting and imaging, respectively. Compared with the conventional dual-energy imaging, the multi-energy-spectrum imaging may significantly improve the ability of substance identification of the system by using more energy information, and has a broader application prospect, especially for identifying contraband which is difficult to be identified, such as drugs, explosives, in the field of security. With regard to the features of the multi-energy-spectrum X-ray imaging, the present disclosure adopts solutions such as the non-linear dimension reduction, the minimum Mahalanobis distance calculation, and the hypothesis test, to avoid complex calculation for projection in a multi-dimensional eigenspace and propose a method of substance identification based on the multi-energy-spectrum X-ray imaging.

BRIEF DESCRIPTION OF THE DRAWINGS

Other details, aspects, and advantages of the present disclosure will become apparent from the following detailed description of the exemplary embodiments with reference to the exemplary drawings, in which.

The drawings do not show all of the circuits or structures of the embodiments. Throughout the figures, same reference numerals represent same or similar parts or features.

DETAILED DESCRIPTION

Specific embodiments of the present disclosure will be described in detail below and please note that the embodiments described herein are used for the purpose of exemplification rather than limitation of the present disclosure. Hereinafter, to provide a thorough understanding of the present disclosure, numerous specific details are set forth. However, it would be obvious for one ordinarily skilled in the art that the present disclosure can be practiced without these specific details. In other examples, known circuits, materials, or methods are not described in detail to avoid any possible obfuscation of the present disclosure.

Throughout the specification, the reference to "an embodiment", "the embodiment", "an example", or "the example" is meant that a specific feature, structure, or feature described with reference to this embodiment or example is contained by at least one embodiment of the present disclosure. Therefore, the phrases "in an embodiment", "in the embodiment", "an example", or "the example" throughout the specification is not necessarily intended to refer to a same embodiment or example. Further, specific features, structures, or characteristics may be combined into one or more embodiments or examples in any suitable combination and/or sub-combination. Further, one ordinarily skilled in the art should appreciate that the drawings provided herein are used for illustration purpose and that the drawings are not necessarily drawn to scale. The term "and/or" used herein comprises any and all combinations of one or more related items that are listed.

Figure 1:
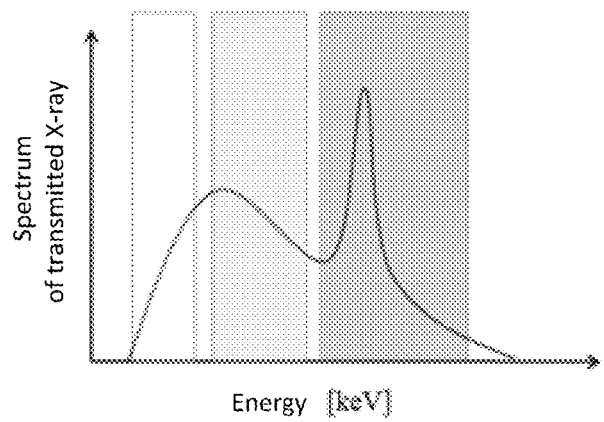
FIG. 1 is a diagram showing energy spectrum threshold division according to an embodiment of the present disclosure.
Figure 2:
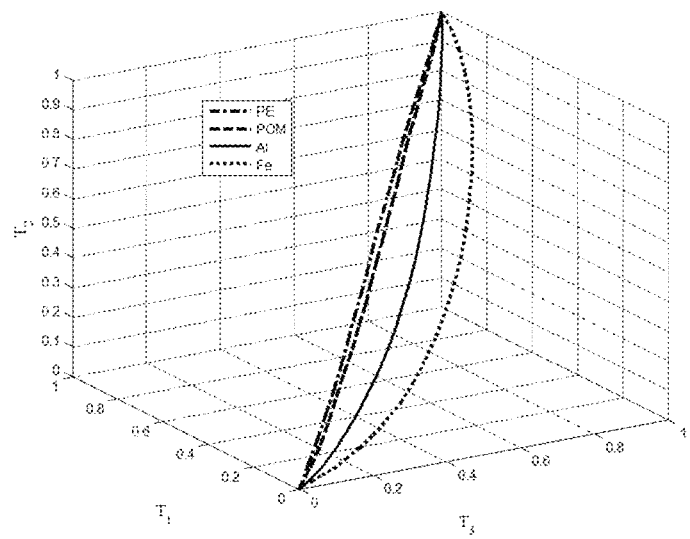
FIG. 2 is a diagram showing transparency value distributions of typical materials in three energy regions according to an embodiment of the present disclosure.
Figure 3:
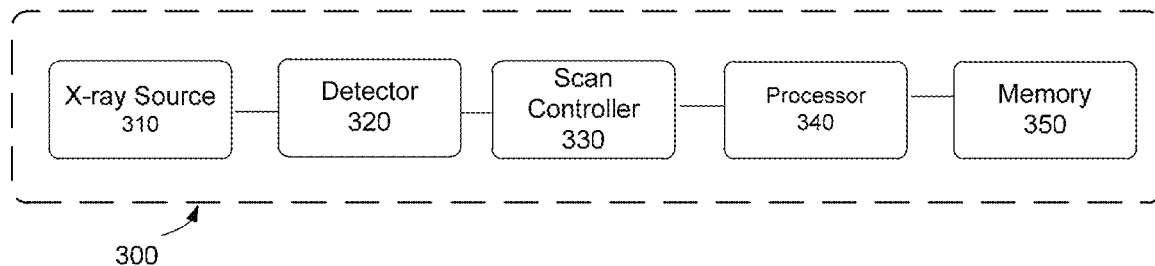
FIG. 3 is a diagram showing a multi-energy-spectrum X-ray imaging system for identifying an item according to an embodiment of the present disclosure.

In an embodiment of the present disclosure, a multi-energy-spectrum X-ray imaging system 300 may consist of, among others, an X-ray source 310, a detector 320, a scan controller 330, a processor 340, a memory 350 etc., as shown in FIG. 3.

Figure 4:
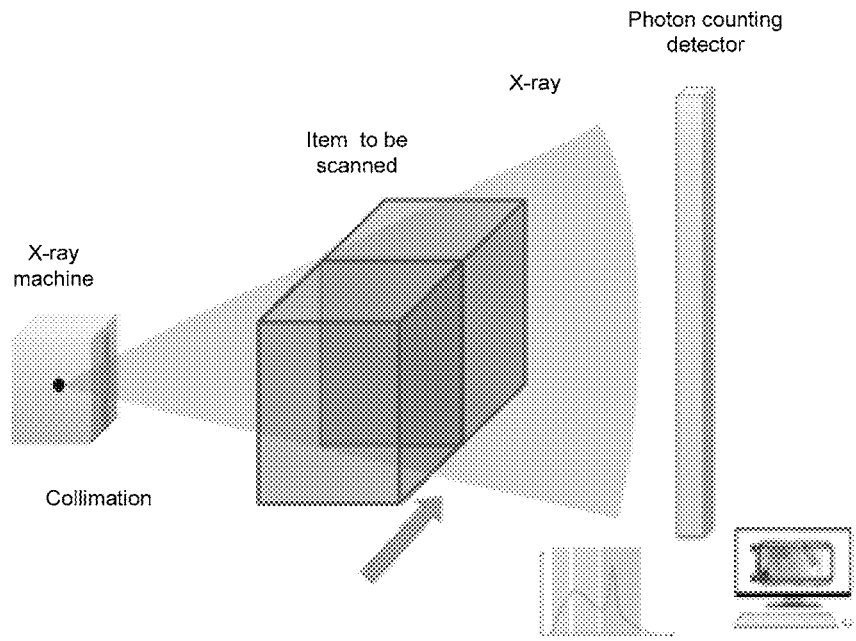
FIG. 4 is a diagram showing identification of an item by using a multi-energy-spectrum X-ray imaging system according to an embodiment of the present disclosure.

The X-ray source 310 may be any device which can acquire an X-ray, such as an isotope radioactive source, an X-ray machine, an accelerator, etc., and a collimated X-ray may be a fan beam, a pencil beam, or a beam having another shape. A photon counting type detector is selected as the detector 320 (as shown in FIG. 4), such as a CZT, a CdTe detector, etc., and an arrangement of the detectors 320 may be a linear array or a multilayer linear array, or may be an area array or a multilayer area array. The detector 320 is configured to receive the X-ray which is emitted from the X-ray source 310 and is transmitted through or scattered by an item to be inspected and convert the received X-ray into an output signal. The scan controller 330 is responsible for controlling the overall scan process comprising the beam out of the X-ray and the control of the belt, the track, or other means for causing relative movement of the X-ray scanning plane with respect to the item to be scanned. The processor 340 may execute program instructions to be operable to: acquire photon counting data for multiple preset different energy spectrum regions and store the data; processing the multi-energy-spectrum data, using the method of multi-energy-spectrum substance identification to identify substance of the item to be scanned, and outputting the identification result and displaying an image. The memory 350 may store the program instructions.

The multi-energy spectrum imaging system firstly acquires the photon counting values for the preset respective energy spectrum regions, and calculate the transparency values $T_i = I^i/I_0^i$ (i=1~N) for the N energy regions through a calibration process, as the features of the substance classification. The calibration process comprises air background correction, dead time correction, pile-up correction, cross-talk correction, or the like. The classification features may also be a values, R values, or the like. Other image features extracted by image preprocessing, such as HOG, SIFT, etc., may also be used as auxiliary features to assist in identifying specific contraband such as explosives, drugs, guns, etc. Image features may also be acquired from the autonomous learning such as deep learning.

The multi-energy-spectrum substance identification comprises a calibration process and a classification process, in which a calibration sample may be designed as several typical materials with different atomic numbers and densities, for example, organic polymer materials such as PE, PMMA, POM, PVDF, and PTFE, and graphite, aluminum, iron, copper, lead, or the like, each of which comprises several steps from thin to thick in terms of thickness or mass thickness, such as 1 mm, 2 mm . . . or 1 g/cm$^2$, 2 g/cm$^2$ . . . . The calibration data is acquired by collecting the scan data for each of the above-described calibration samples in respective energy regions for one or more times. The accuracy of material identification can be further improved by an appropriate increase in the number of kinds of the calibration samples and the number of the thickness steps. The training data for various categories of drugs, explosives, or mimetic materials, such as black powder, TNT, C4, RDX (cyclotrimethylene trinitramine), ecstasy, heroin and so on are added in the calibration database, which can make the system's identification of contraband, such as drugs and explosives, more targeted to improve the identification rate of such contraband.

The classification process is used for items to be inspected which have unknown types and provides a judgment in the classification property. The main purpose is to acquire the atomic number, mass thickness value, density, and other information of the item to be inspected.

Based on the state of the art and the characteristics of multi-energy-spectrum imaging, the present disclosure proposes a method for substance identification based on multi-energy-spectrum X-ray imaging, in which it is assumed that there are M calibration material classes $\omega_i$ (i=1~M) and N energy regions.

First Embodiment (the Minimum Distance Classification Method)

In a multi-dimensional eigenspace, a distance $d_i$ between a transparency value of an item to be inspected and a calibration classification curve $f(Z_i,t)$ is calculated. In a case where the item to be inspected is located between the atomic numbers $Z_j$ and $Z_k$ of two adjacent calibration materials, the projection distances from $d_j$ and $d_k$ to a line segment between the two calibration materials are calculated as the weights for the linear interpolation. In this solution, calibration data is firstly acquired by a calibration process, and it is assumed that the Z values of adjacent calibration materials are close to each other and that the linear distance between the materials is approximately the geodesic distance. Therefore, the difference may be ignored as a system error. The specific process of the minimum distance classification method is as follows.

Firstly, in the calibration process, the mean values and the covariance matrix $S_{N \times N}(\omega_i, t_j)$ (i=1 . . . M, j=1 . . . K, where M represents a number of calibration materials, and K represents a number of mass thicknesses for each calibration material) of the transparency values of various kinds of calibration materials with various thicknesses in the respective N energy regions are acquired, respectively, after multiple measurements; In a case where discrete energy regions of the multi-energy-spectrum imaging are independent to each other, the covariance matrix S may be typically reduced to a diagonal matrix as shown by the equation (2), in which the diagonal elements represent the variance values of the corresponding energy regions, respectively. For example, $\sigma_1^2$ represents a variance value of a certain material with a certain thickness in a first energy region.

$$S_{N \times N} = \begin{bmatrix} \sigma_1^2 & 0 & \ldots & 0 \\ 0 & \sigma_2^2 & \ldots & 0 \\ \vdots & \vdots & \ddots & \vdots \\ 0 & 0 & \ldots & \sigma_N^2 \end{bmatrix} \quad (2)$$

For training data of the contraband, the same calculation method is used to form and store a contraband database.

The multi-energy-spectrum image of the item to be inspected is scanned, and according to a transparency value acquired in a certain energy region (which may be one or more energy regions), a thickness range of the calibration materials in this energy region which meets this transparency value is found. The Mahalanobis distances $d(m, \omega_i)$ from the item to be inspected m to the transparency mean values $\overline{X^{\omega_i}}$ of various kinds of materials $\omega_i$ in the thickness range are calculated by the following equation:

$$d^2(m,\omega_i) = (X^m - \overline{X^{\omega_i}})^T \cdot S^{-1}(\omega_i) \cdot (X^m - \overline{X^{\omega_i}}) \quad (3)$$

where $X^m = (T_{m1}, T_{m2}, \ldots T_{mN})$ represents a vector consisting of transparency values of the item to be inspected in the N energy regions, and $\overline{X^{\omega_i}} = (T\omega_i^1, T\omega_i^2, \ldots T\omega_i^N)$ represents a vector consisting of transparency mean value of the material $\omega_i$ in the N energy regions. Of course, different distance calculation methods, such as the Euclidean distance or the Cosine distance algorithm, may be used in this solution.

By traversing various kinds, the kind of the corresponding calibration material with a minimum Mahalanobis distance $d(m, \omega_i)$ is found, and the kind of this calibration material is determined as the substance kind of the item to be inspected.

In some embodiments, the substance kind of the item to be inspected can be determined more accurately. Firstly, an atomic number and a thickness of a calibration material A with the minimum Mahalanobis distance $d(m, \omega_i)$ and an atomic number and a thickness of a calibration material B with a next minimum Mahalanobis distance $d(m, \omega_j)$ are determined. Then, when the thickness of the calibration material A and the thickness of the calibration material B are the same, it can be considered that the item to be inspected is located between two calibration materials A and B with a same thickness; when the atomic number of the calibration material A and the atomic number of the calibration material B are the same, it can be considered that the item to be inspected is located between the same calibration materials with two mass thicknesses; and when the thickness of the calibration material A is different from the thickness of the calibration material B and the atomic number of the calibration material A is different from the atomic number of the calibration material B, it can be considered that the item to be inspected is located between two calibration materials with two mass thicknesses.

For example, in a case where the item to be inspected is located between two calibration materials A and B with the same thickness, by calculating the projection distance of $d(m,A)$ and $d(m, B)$ in a direction of $\overline{X^A} - \overline{X^B}$ as the weight factors for the linear interpolation, the atomic number Z of the item to be inspected m is calculated, as shown by the equation (4).

$$Z = \frac{Z_A \times (d(m, B) \cdot \cos\theta_{mBA}) + Z_B \times (d(m, A) \cdot \cos\theta_{mAB})}{d(m, B) \cdot \cos\theta_{mBA} + d(m, A) \cos\theta_{mAB}} \quad (4)$$

where $Z_A$ and $Z_B$ are atomic number values of the calibration materials A and B, respectively, and $\theta_{mBA}$ and $\theta_{mAB}$ are the angle between $\overline{X^m} - \overline{X^B}$ direction and $\overline{X^B} - \overline{X^A}$ direction and the angle between $\overline{X^m} - \overline{X^A}$ direction and $\overline{X^A} - \overline{X^B}$ direction, respectively.

In a case where the item to be inspected is located between the same calibration materials with two mass thicknesses, the mass thickness t of the item to be inspected is calculated by a linear interpolation method similar to the above method.

In a case where the item to be inspected is located between two calibration materials with two mass thicknesses, the atomic number Z and the mass thickness value t of the material are calculated by the bilinear interpolation method.

In cases where Z and t match the threshold range for the common drugs and explosives, the same algorithm process is used to calculate the Mahalanobis distances between the item to be inspected and the drug/explosives in the contraband database one by one, and the contraband kind with the highest probability is determined based on the minimum distance principle.

Figure 5:
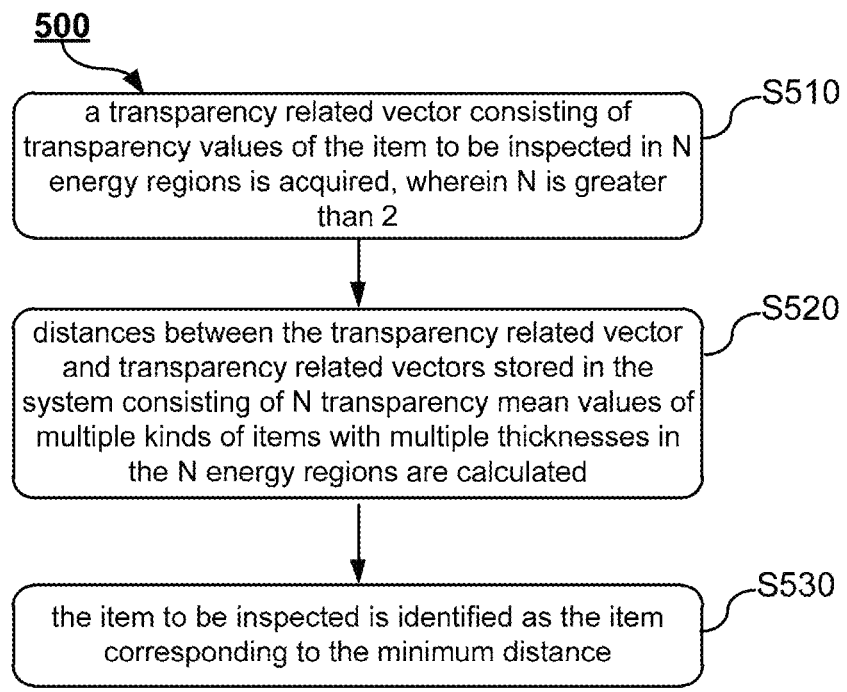
FIG. 5 is a flow chart showing a first method of identifying an item by using a multi-energy-spectrum X-ray imaging system according to a first embodiment of the present disclosure.

FIG. 5 is a flow chart showing a first method 500 of substance identification of an item to be inspected by using a multi-energy-spectrum X-ray imaging system according to a first embodiment of the present disclosure. The method 500 comprises: at step S510, a transparency related vector consisting of transparency values of the item to be inspected in N energy regions is acquired, wherein N is greater than 2; at step S520, distances between the transparency related vector and transparency related vectors stored in the system consisting of N transparency mean values of multiple kinds of items with multiple thicknesses in the N energy regions are calculated; and at step S530, the item to be inspected is identified as the item corresponding to the minimum distance. The transparency mean value is a mean value of multiple transparency values acquired by multiple measurements in a certain energy region.

The calculation of distances between the transparency related vector and transparency related vectors stored in the system consisting of N transparency mean values of multiple kinds of items with multiple thicknesses in the N energy regions may comprise that the Mahalanobis distance algorithm, the Euclidean distance algorithm, or the Cosine distance algorithm is used for calculating the distances.

The method 500 may be performed by the multi-energy-spectrum X-ray imaging system 300. In such a case, the processor 340 may be configured to execute program instructions to be operable to acquire a transparency related vector consisting of transparency values of the item to be inspected in N energy regions, wherein N is greater than 2; calculate distances between the transparency related vector and transparency related vectors stored in the system consisting of N transparency mean values of multiple kinds of items with multiple thicknesses in the N energy regions; and identify the item to be inspected as the item corresponding to the minimum distance.

Figure 6:
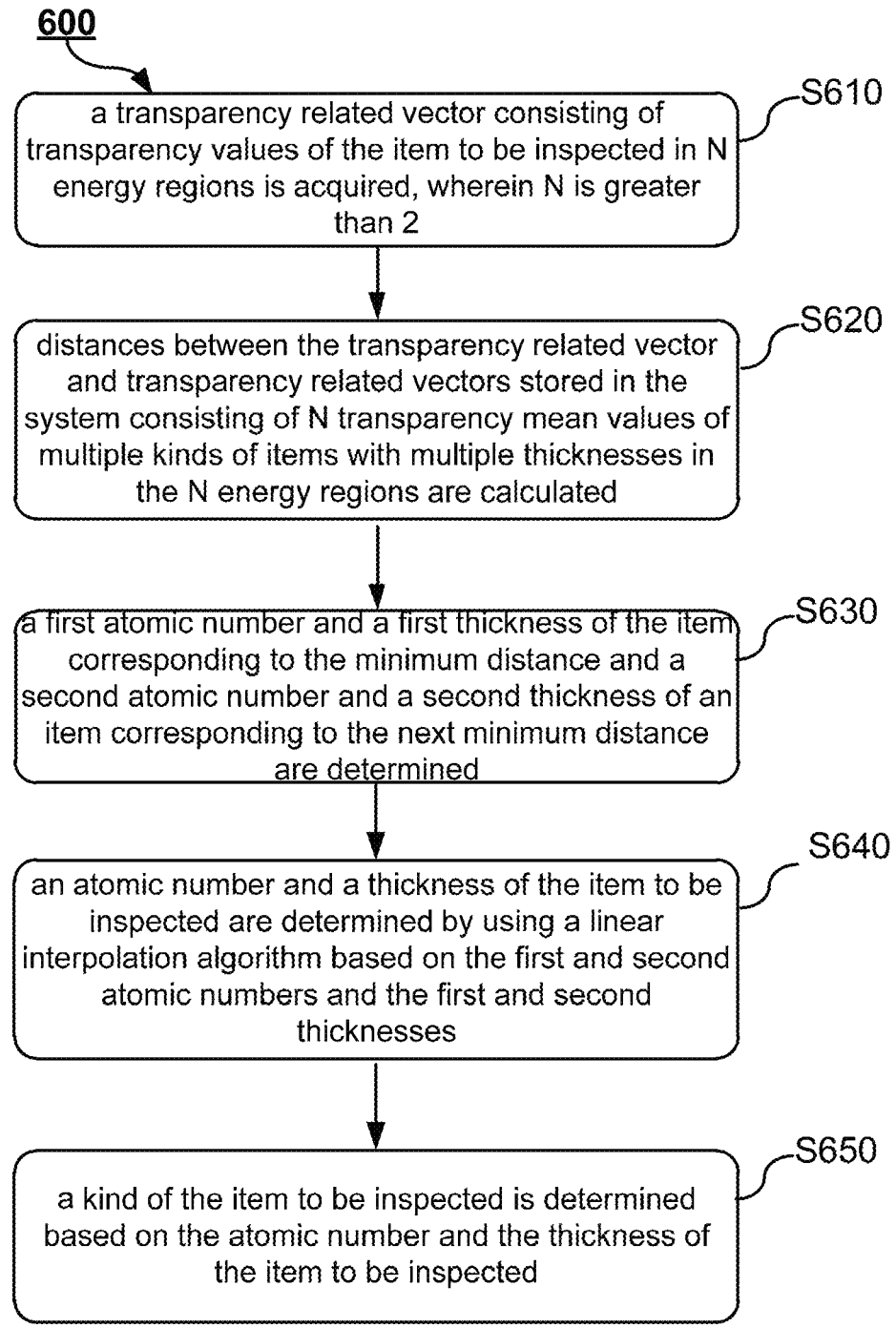
FIG. 6 is a flow chart showing a second method of identifying an item by using a multi-energy-spectrum X-ray imaging system according to a first embodiment of the present disclosure.

FIG. 6 is a flow chart showing a second method 600 of substance identification of an item to be inspected by using a multi-energy-spectrum X-ray imaging system according to a first embodiment of the present disclosure. The method 600 comprises: at step S610, a transparency related vector consisting of transparency values of the item to be inspected in N energy regions is acquired, wherein N is greater than 2; at step S620, distances between the transparency related vector and transparency related vectors stored in the system consisting of N transparency mean values of multiple kinds of items with multiple thicknesses in the N energy regions are calculated; and at step S630, a first atomic number and a first thickness of the item corresponding to the minimum distance and a second atomic number and a second thickness of an item corresponding to the next minimum distance are determined; at step S640, an atomic number and a thickness of the item to be inspected are determined by using a linear interpolation algorithm based on the first and second atomic numbers and the first and second thicknesses; and at step S650, a kind of the item to be inspected is determined based on the atomic number and the thickness of the item to be inspected.

The calculation of distances between the transparency related vector and transparency related vectors stored in the system consisting of N transparency mean values of multiple kinds of items with multiple thicknesses in the N energy regions may comprise that the Mahalanobis distance algorithm, the Euclidean distance algorithm, or the Cosine distance algorithm is used for calculating the distances.

The linear interpolation algorithm is a one-dimensional linear interpolation algorithm when the first atomic number is same as the second atomic number and the first thickness is different from the second thickness. The linear interpolation algorithm is a two-dimensional linear interpolation algorithm when the first atomic number is different from the second atomic number and the first thickness is different from the second thickness. The linear interpolation algorithm is a one-dimensional linear interpolation algorithm when the first atomic number is different from the second atomic number and the first thickness is same as the second thickness.

The method 600 may be performed by the multi-energy-spectrum X-ray imaging system 300. In such a case, the processor 340 may be configured to execute program instructions to be operable to acquire a transparency related vector consisting of transparency values of the item to be inspected in N energy regions, wherein N is greater than 2; calculate distances between the transparency related vector and transparency related vectors stored in the system consisting of N transparency mean values of multiple kinds of items with multiple thicknesses in the N energy regions; determine a first atomic number and a first thickness of the item corresponding to the minimum distance and a second atomic number and a second thickness of an item corresponding to the next minimum distance; determine an atomic number and a thickness of the item to be inspected by using a linear interpolation algorithm based on the first and second atomic numbers and the first and second thicknesses; and determine a kind of the item to be inspected based on the atomic number and the thickness of the item to be inspected. The processor 340 is further configured to calculate distances between the transparency related vector and transparency related vectors stored in the system consisting of N transparency mean values of multiple kinds of items with multiple thicknesses in the N energy regions by using the Mahalanobis distance algorithm, the Euclidean distance algorithm, or the Cosine distance algorithm. The transparency related vector may be a vector consisting of the transparency values or transparency mean values directly, or a vector consisting of logarithms of the transparency values or transparency mean values.

Figure 7:
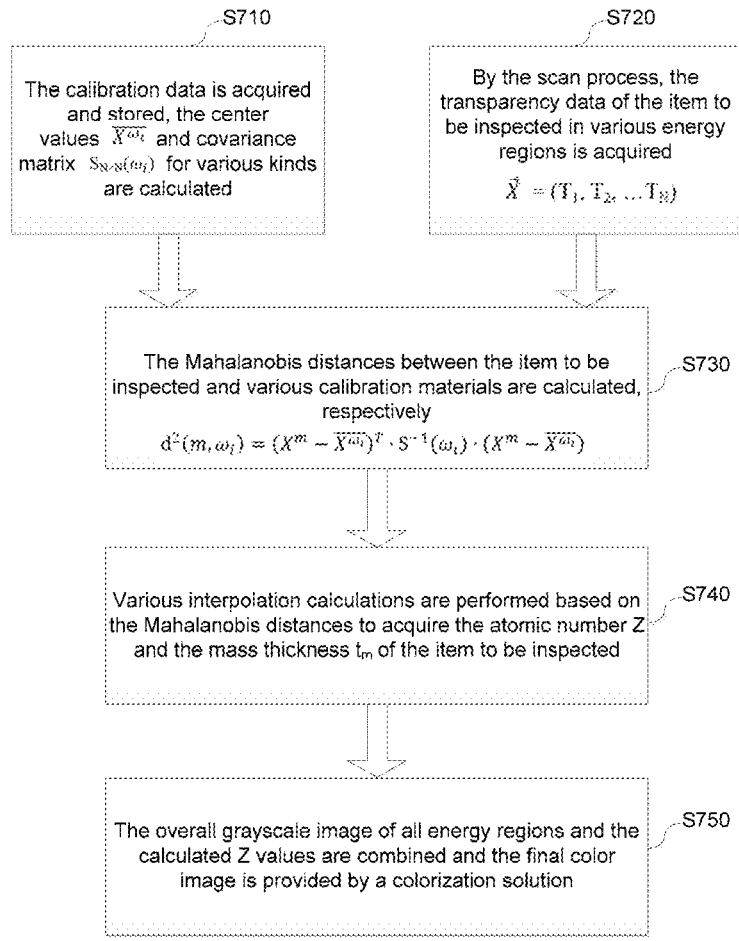
FIG. 7 is a flow chart showing multi-energy-spectrum substance identification by using the minimum Mahalanobis distance method according to an embodiment of the present disclosure.

A specific example of the first embodiment is given below as shown in FIG. 7.

An X-ray machine with an energy value of 160 keV is used to generate X-rays, forming a fan beam through a collimated slit. The scanned transmission images are captured by using a CZT single photon counting linear array detector. The processor may simultaneously acquire photon counting data for three or more different preset energy spectrum regions. For example, the energy spectrum is divided into three energy regions: 25 keV 45 keV, 50 keV 70 keV, and 80 keV 160 keV.

At step S710, typical calibration material steps are designed comprising at least four calibration materials, polyethylene (PE, Z=5.5), polyoxymethylene resin (POM, Z=7.0), aluminum (Al, Z=13), and iron (Fe, Z=26). Each material comprises several steps from thin to thick. Image data for air, background, and respective material steps are collected, and the transparency mean values $\overline{X}^{\omega_i}$ and the covariance matrix $S_{3 \times 3}(\omega_i, t_j)$ (i=1 ... 4, j=1 ... K, where K represents the number of mass thicknesses of a certain calibration material) of the various materials are calculated.

At step S720, the multi-energy-spectrum image of the item to be inspected is scanned, the transparency value $T_0$ is calculated based on all the energy spectrums, and a thickness range of each calibration material corresponding to this transparency value is found.

At step S730, the Mahalanobis distances $d(m, \omega_i)$ from the vector related to transparency values of the item to be inspected to the vector related to the transparency mean values $\overline{X}^{\omega_i}$ of various kinds of materials $\omega_i$ in the thickness range are calculated according to the equation (3);

In an example, by traversing various kinds, the atomic number of the kind of the corresponding calibration material with a minimum Mahalanobis distance is found as the atomic number of the item to be inspected.

In another example, as at step S740, in a case where the item to be inspected is located between two calibration materials A and B, for example, an unknown material located between PE and POM, by calculating the projection distance of d(m, A) and d(m, B) in the direction of $\overline{X^A}$-$\overline{X^B}$ as the weight factor for the linear interpolation, the atomic number value Z of this material is calculated based on the equation (4).

In a case where the item to be inspected is located between the same calibration materials with two mass thicknesses, the mass thickness t of the item to be inspected is calculated by a method similar to the above linear interpolation method.

In a case where the item to be inspected is located between two calibration materials with two mass thicknesses, the atomic number Z and the mass thickness value t of the item to be inspected are calculated by the bilinear interpolation method.

In cases where the above acquired Z and t match the preset threshold range for the common drugs and explosives, the same algorithm process is used to further calculate the Mahalanobis distances between the item to be inspected and the drug/explosives in the contraband database one by one, and the contraband kind of the item to be inspected with the highest probability is determined based on the minimum distance principle.

At step S750, based on the $T_0$ and Z values of the item to be inspected, a color image for display is generated by a colorization process. For the case where contraband is identified during the scanning, an alarm is automatically raised and the suspect area is identified.

Second Embodiment (the Non-Linear Dimension Reduction Classification Method)

By reducing dimensions in a non-linear manner, the data for the item to be inspected and the calibration data are mapped into a two-dimensional plane together. At this time, the multi-dimensional classification problem is converted to a two-dimensional classification problem, while the projection of the item to be inspected on f(Z, t) after the mapping is acquired directly.

The non-linear dimension reduction method mainly comprises the multi-dimensional scaling (MDS), the local linear embedded (LLE) algorithm, and the isometric mapping (Isomap) algorithm, or the like. The main objective of the isometric mapping (Isomap) algorithm is to find the corresponding low-dimensional embedding for a given high-dimensional manifold, so that the neighborhood structure between the data points on the high-dimensional manifold can be maintained in the low-dimensional embedding. Isomap uses MDS as a calculation tool, which is characterized by calculating the distance between the data points on the high-dimensional manifold, using the geodesic distance in the differential geometry, and finding an algorithm to estimate the geodesic distance from the actual input data, which is very suitable for solving multi-energy-spectrum substance identification problems. A detailed description of the non-linear dimension reduction method will be given below.

Firstly, transparency mean values of multiple calibration materials with multiple thicknesses in N energy regions after multiple measurements are calculated, which form transparency related vectors corresponding to the calibration materials as the calibration data and are stored in the multi-energy-spectrum X-ray imaging system. Next, the item material to be inspected is scanned to acquire a transparency related vector consisting of transparency values of the item material to be inspected in N energy regions as data of the item to be inspected, wherein N is greater than 2. The transparency related vector may be a vector consisting of the transparency values or transparency mean values directly, or a vector consisting of logarithms of the transparency values or transparency mean values.

The transparency related vector for the item material to be inspected and transparency related vectors stored in the system consisting of N transparency mean values of multiple kinds of items with multiple thicknesses in the N energy regions are mapped into a two-dimensional plane by using a non-linear dimension reduction algorithm, for example, the Isomap algorithm or the LLE algorithm, so as to acquire a mapping point of the transparency related vector of the item material to be inspected in the two-dimensional plane and a set of mapping points of the transparency related vectors of the multiple kinds of calibration materials in the two-dimensional plane, respectively. Some parameters of the non-linear dimension reduction algorithm, for example, the neighbor parameter k, may be optimized based on the practical needs, to ensure that the result of the dimension reduction mapping is stable and reliable.

Figure 8:
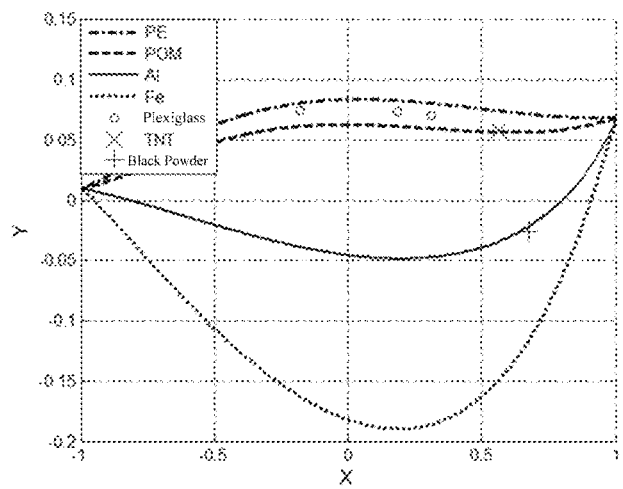
FIG. 8 is a curve graph showing calibration data and data for item to be inspected which is mapped into a two-dimensional plane by non-linear dimension reduction according to an embodiment of the present disclosure.

The mapped data still maintains the classification characteristics in the eigenspace, and the calibration data contains the corresponding category information. The atomic number Z and the mass thickness t of the item to be inspected can be directly determined based on the positional relationship of the mapped data for the item to be inspected on the two-dimensional eigen plane (as shown in FIG. 8). For example, a point of the set of mapping points which is closest to the mapping point can be determined by using the minimum distance principle, and the item to be inspected is identified as the one of the multiple calibration materials corresponding to the closest point.

For the case of suspected drugs/explosives, calibration data for various common drugs and explosives can be added to the above calibration data, and the above process is repeated to determine or distinguish between the kinds of drugs or explosives based on the positional relationship between various data points after the mapping and the minimum distance principle.

Figure 9:
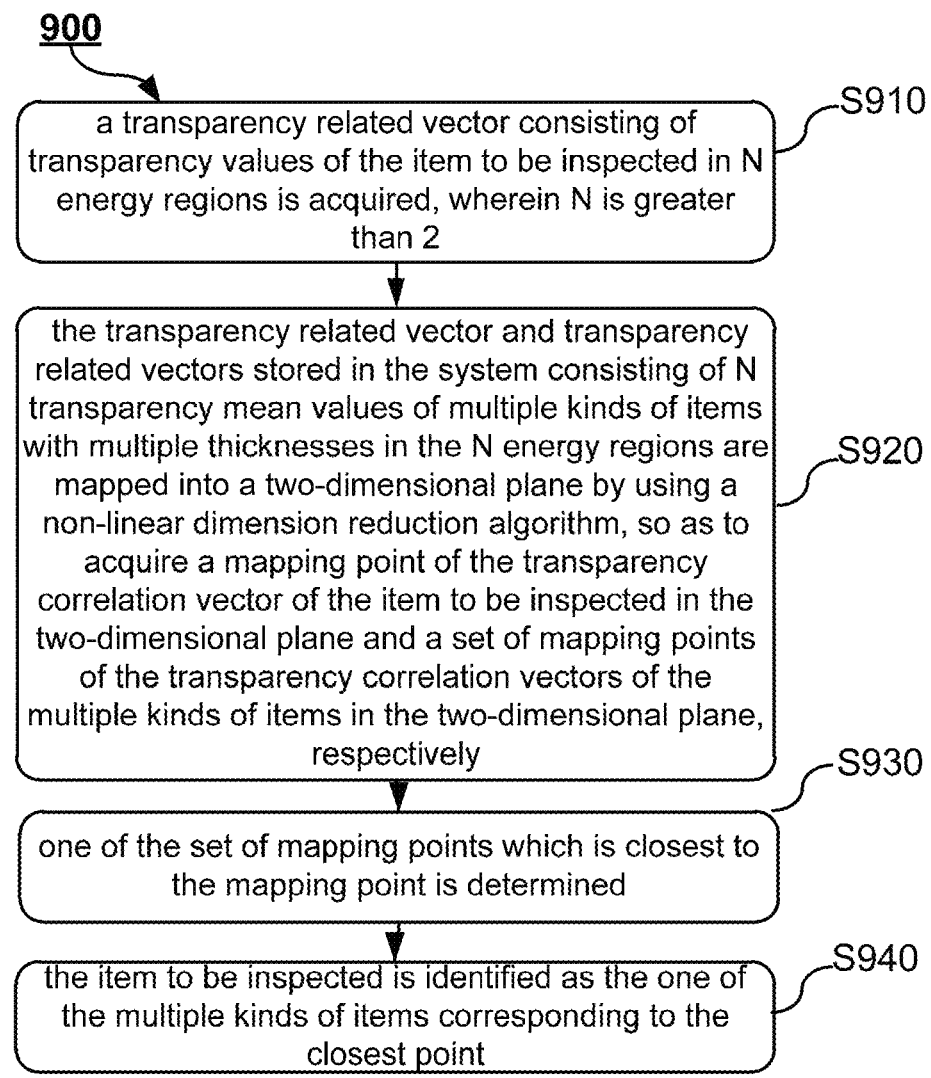
FIG. 9 is a flow chart showing a method of identifying an item by using a multi-energy-spectrum X-ray imaging system according to a second embodiment of the present disclosure.

FIG. 9 is a flow chart showing a method 900 of substance identification of an item to be inspected by using a multi-energy-spectrum X-ray imaging system according to a second embodiment of the present disclosure. The method 900 comprises: at step S910, a transparency related vector consisting of transparency values of the item to be inspected in N energy regions is acquired, wherein N is greater than 2; at step S920, the transparency related vector and transparency related vectors stored in the system consisting of N transparency mean values of multiple kinds of items with multiple thicknesses in the N energy regions are mapped into a two-dimensional plane by using a non-linear dimension reduction algorithm, so as to acquire a mapping point of the transparency related vector of the item to be inspected in the two-dimensional plane and a set of mapping points of the transparency related vectors of the multiple kinds of items in the two-dimensional plane, respectively; at step S930, one of the set of mapping points which is closest to the mapping point is determined; and at step S940, the item to be inspected is identified as the one of the multiple kinds of items corresponding to the closest point.

The non-linear dimension reduction algorithm comprises the isometric mapping (Isomap) algorithm, the local linear embedded (LLE) algorithm, and the multi-dimensional scaling (MDS) algorithm. The determination of a point of the set of mapping points which is closest to the mapping point may comprise that the Mahalanobis distance algorithm, the Euclidean distance algorithm, or the Cosine distance algorithm is used to determine the point which is closest to the mapping point. The multiple kinds of items comprise explosives.

The method 900 may be performed by the multi-energy-spectrum X-ray imaging system 300. In such a case, the processor 340 may be configured to execute program instructions to be operable to acquire a transparency related vector consisting of transparency values of the item to be inspected in N energy regions, wherein N is greater than 2; map the transparency related vector and transparency related vectors stored in the system consisting of N transparency mean values of multiple kinds of items with multiple thicknesses in the N energy regions into a two-dimensional plane by using a non-linear dimension reduction algorithm, so as to acquire a mapping point of the transparency related vector of the item to be inspected in the two-dimensional plane and a set of mapping points of the transparency related vectors of the multiple kinds of items in the two-dimensional plane, respectively; determine one of the set of mapping points which is closest to the mapping point; and identify the item to be inspected as the one of the multiple kinds of items corresponding to the closest point.

Third Embodiment (the Relative Mass Attenuation Coefficient Classification Method)

The image of the item to be inspected is scanned and a relative mass attenuation coefficient $R_i$ of the item to be inspected (for example, the TNT material in FIG. 10) in the $i^{th}$ energy region of the N energy regions is calculated.

$$R_i = \ln T_i / \ln T_0 \quad (5)$$

where $T_0$ can be a transparency value calculated from all the energy spectrums, or a transparency value calculated from any one or more specific energy regions, and $T_i$ represents the transparency value calculated from each energy region, i=1 ... N. According to the $\chi^2$ test method of the hypothesis test theory, $\chi^2$ between the item to be inspected m and the various calibration materials $\omega_1$ (for example, PE, PMMA, POM and Al materials in FIG. 10) are calculated, respectively:

$$\chi^2 = \sum_{i=1}^{N} \frac{(R_i^m - R^{\omega_i})^2}{R^{\omega_i}}, i = 1 \ldots N \quad (6)$$

where $R_I^m$ is the relative mass attenuation coefficient value of the item to be inspected m in the $i^{th}$ energy region, and $R^{\omega_i}$ is the relative mass attenuation coefficient value of the calibration material $\omega_i$ in the $i^{th}$ energy region. The atomic number Z of the corresponding calibration material when $\chi^2$ is minimized is determined, and the atomic number of the item to be inspected is determined as the atomic number of the calibration material. The scheme is suitable for the case where the number of energy regions is large and the energy regions are narrow.

Figure 10:
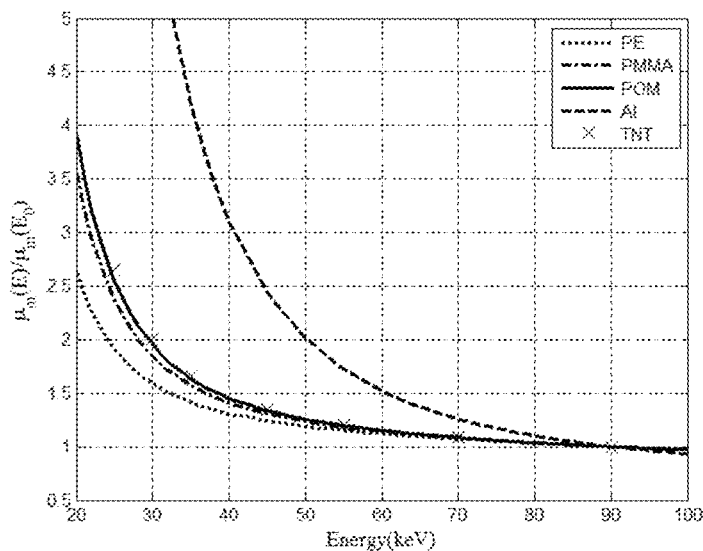
FIG. 10 is a curve graph showing relative mass attenuation coefficients of typical materials according to an embodiment of the present disclosure.

In a specific example, certain hypothesis tests are performed with the relative mass attenuation coefficient curves for various calibration materials by calculating the relative mass attenuation coefficients corresponding to the average energy of respective energy regions, respectively. The equivalent mass attenuation coefficient curves for different calibration materials can be looked up in NIST. FIG. 10 shows the relative mass attenuation coefficient distributions for several typical polymers and TNTs corresponding to different energy values.

Similarly, for suspected contrabands, $\chi^2$ of the suspected contrabands with respect to the relative attenuation coefficient curves of known contraband such as drugs, explosives, and so on are calculated respectively, and based on the minimum $\chi^2$ criteria, the item to be inspected is determined to belong to which kind of specific contraband with a highest probability.

The solution also comprises using other hypothesis test methods or similarity calculation methods. The mass attenuation coefficient curve for the calibration materials can also be acquired by actually scanning the calibration material step data via fitting or interpolation.

Figure 11:
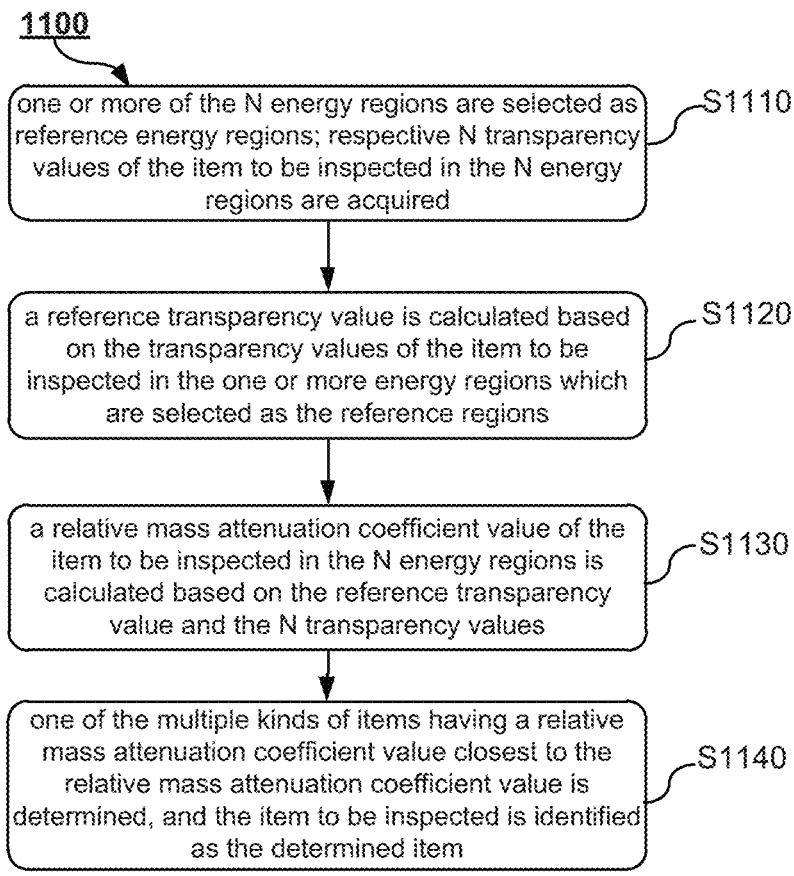
FIG. 11 is a flow chart showing a method of identifying an item by using a multi-energy-spectrum X-ray imaging system according to a third embodiment of the present disclosure.

FIG. 11 is a flow chart showing a method 1100 of substance identification of an item to be inspected by using a multi-energy-spectrum X-ray imaging system according to a third embodiment of the present disclosure. The method 1100 may comprise: at step S1110, one or more of the N energy regions are selected as reference energy regions; respective N transparency values of the item to be inspected in the N energy regions are acquired; at step S1120, a reference transparency value is calculated based on the transparency values of the item to be inspected in the one or more energy regions which are selected as the reference regions; at step S1130, a relative mass attenuation coefficient value of the item to be inspected in the N energy regions is calculated based on the reference transparency value and the N transparency values; at step S1140, one of the multiple kinds of items having a relative mass attenuation coefficient value closest to the relative mass attenuation coefficient value is determined, and the item to be inspected is identified as the determined item. The selection of one or more of the N energy regions as reference energy regions may comprise: selecting all the N energy regions as the reference energy regions. The selection of one or more of the N energy regions as reference energy regions may comprise: selecting any one of the N energy regions as the reference energy region. The determination of one of the multiple kinds of items having a relative mass attenuation coefficient value closest to the relative mass attenuation coefficient value and the identification of the determined item as the item to be inspected may comprise: determining one of the multiple kinds of items having a relative mass attenuation coefficient value closest to the relative mass attenuation coefficient value by using the minimum mean square error method. The determination of one of the multiple kinds of items having a relative mass attenuation coefficient value closest to the relative mass attenuation coefficient value and the identification of the item to be inspected as the determined item comprises: determining one of the multiple kinds of items having a relative mass attenuation coefficient value closest to the relative mass attenuation coefficient value by minimizing $\chi^2$ determined according to the equation (6).

The method 1100 may be performed by the multi-energy-spectrum X-ray imaging system 300. In such a case, the processor 340 is further configured to execute program instructions to be operable to select one or more of the N energy regions as reference energy regions; acquire respective N transparency values of the item to be inspected in the N energy regions; calculate a reference transparency value based on the transparency values of the item to be inspected in the one or more energy regions which are selected as the reference regions; calculate a relative mass attenuation coefficient value of the item to be inspected in the N energy regions based on the reference transparency value and the N transparency values; determine one of the multiple kinds of items having a relative mass attenuation coefficient value closest to the relative mass attenuation coefficient value, and identify the item to be inspected as the determined item.

The technical solution proposed by the present disclosure may be applied to (but not limited to) different energy spectrum imaging devices such as X-ray single viewing angle, double viewing angle, multi viewing angle transmission imaging and CT imaging.

Compared with the conventional dual energy X-ray imaging system, the multi-energy-spectrum imaging can significantly improve the system's ability to identify the substance. The object of the present invention is to realize a novel substance identification method for a multi-energy-spectrum X-ray imaging system, so as to effectively utilize the substance identification ability of a multi-energy-spectrum imaging system. It can be applied in the field of security and other fields, particularly for identification of drug/explosives. By studying the multi-energy-spectrum substance identification issues, with regard to the features of the multi-energy-spectrum imaging, the present disclosure adopts solutions such as the non-linear dimension reduction, the minimum Mahalanobis distance calculation, and the hypothesis test, to avoid complex calculation for projection in a multi-dimensional eigenspace and propose a method of substance identification based on the multi-energy-spectrum X-ray imaging.

Figure 12:
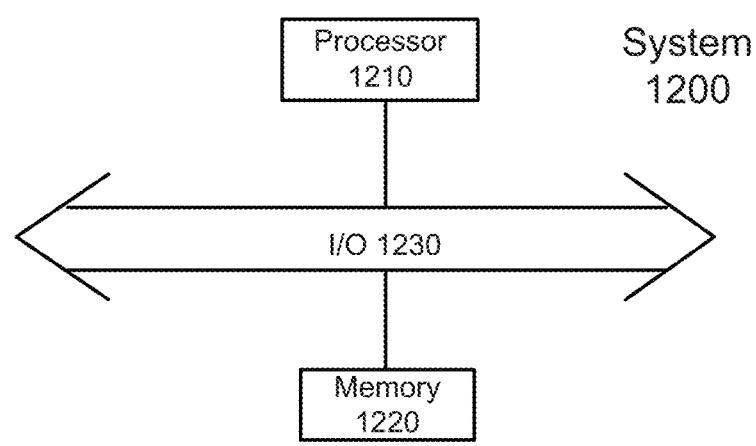
FIG. 12 is a diagram showing a multi-energy-spectrum X-ray imaging system for identifying an item according to an embodiment of the present disclosure.

FIG. 12 is a schematic diagram showing a system 1200 of identifying an item by using a multi-energy-spectrum X-ray imaging system according to a third embodiment of the present disclosure. The system 1200 comprises a processor 1210, for example, a digital signal processor (DSP). The processor 1210 may be a single device or a plurality of devices configured to perform different actions of the processes described herein. The system 1200 may further comprise an input/output (I/O) device 1230 configured to receive signals from other entities or transmit signals to other entities.

In addition, the system 1200 comprises a memory 1220 which may have a form of: nonvolatile or volatile memory, such as electrically erasable programmable read-only memory (EEPROM), flash memory, and the like. The memory 1220 stores computer-readable instructions which cause the processor to perform the actions described herein when the processor 1210 executes the computer-readable instructions.

It should be noted that the transparency mean values used herein in the present disclosure are the result obtained by acquiring multiple transparency values with multiple measurements in a specific energy region and acquiring mean values of the multiple transparency values.

Some block diagrams and/or flowcharts are shown in the accompanying drawings. It should be understood that some of the blocks or any combination thereof in the block diagrams and/or flowcharts may be implemented by computer program instructions. These computer program instructions may be provided to processors of a general purpose computer, a dedicated computer, or other programmable data processing device, such that these instructions, when executed by the processor, may create devices which implement the functions/operations described in these block diagrams and/or flowcharts.

Thus, the techniques of the present disclosure may be implemented in the form of hardware and/or software (comprising firmware, microcode, etc.). In addition, the techniques of the present disclosure may take the form of a computer program product on a computer readable medium storing instructions, which computer program product may be used by an instruction execution system (e.g., one or more processors) or in conjunction with an instruction execution system. In the context of this disclosure, a computer-readable medium may be any medium capable of containing, storing, transmitting, propagating, or transmitting instructions. For example, a computer-readable medium may comprise, but not limited to, electrical, magnetic, optical, electromagnetic, infrared medium, or a semiconductor system, a device, an apparatus, or a propagation medium. Specific examples of a computer-readable medium comprises a magnetic storage device, such as a magnetic tape or hard disk (HDD), an optical storage device such as an optical disk (CD-ROM); a memory, such as a random access memory (RAM) or flash memory; and/or a wired/wireless communication link.

The above detailed description has already set forth numerous embodiments of the method of identifying an item by using a multi-energy-spectrum X-ray imaging system and a multi-energy-spectrum X-ray imaging system with reference to the diagrams, flow charts, and/or examples. In the case where the diagrams, flow charts, and/or examples comprise one or more functions and/or operations, one skilled in the art should appreciate that each function and/or operation in the diagrams, flow charts, or examples may be implemented by various structures, hardware, software, firmware or any combination thereof either alone and/or in any combination. In an embodiment, several parts of the subject matter described in the embodiments of the present disclosure may be implemented by Application Specific Integrated Circuit (ASIC), Field Programmable Gate Array (FPGA), Digital Signal Processor (DSP), or any other integrated form. However, one skilled in the art should appreciate that some aspects of the embodiment disclosed herein may be partially or wholly implemented in an integrated circuit equivalently, implemented as one or more computer programs running on one or more computers (for example, one or more programs running on one or more computer systems), implemented as one or more programs running on one or more processors (for example, one or more programs running on one or more micro-processors), implemented as firmware, or substantially any combination thereof, and one skilled in the art is capable to design the circuit and/or write software and/or firmware code. Further, one skilled in the art would appreciate that the mechanism of the subject matter of the present disclosure may be distributed in various forms of program products, and the exemplary embodiments of the subject matter of the present disclosure may be applicable irrespective of the specific types of signal carrier media for distribution. Examples of the signal carrier media comprise but not limited to: a recordable medium such as floppy disk, hard drive, compact disk (CD), digital versatile disk (DVD), digital tape, computer memory, etc.; and a transmission medium, such as digital and/or analog communication medium (for example, optical fiber, waveguide, wired communication link, wireless communication link, etc.)

We claim:

1. A method of substance identification of an item to be inspected using a multi-energy-spectrum X-ray imaging system, the method comprising:

acquiring a transparency related vector consisting of transparency values of the item to be inspected in N energy regions, wherein N is greater than 2; and determining the item to be inspected based on the transparency related vector;

wherein the determining the item to be inspected based on the transparency related vector comprises:

calculating distances between the transparency related vector and transparency related vectors stored in the system consisting of N transparency mean values of multiple kinds of items with multiple thicknesses in the N energy regions; and determining a first atomic number and a first thickness of the item corresponding to the minimum distance and a second atomic number and a second thickness of an item corresponding to the next minimum distance;

determining an atomic number and a thickness of the item to be inspected by using a linear interpolation algorithm based on the first and second atomic numbers and the first and second thicknesses; and determining a kind of the item to be inspected based on the atomic number and the thickness of the item to be inspected.

2. The method of claim 1, wherein the determining one of the set of mapping points which is closest to the mapping point comprises:

determining a point which is closest to the mapping point by using the Mahalanobis distance algorithm, the Euclidean distance algorithm, or the Cosine distance algorithm.

3. A method of substance identification of an item to be inspected using a multi-energy-spectrum X-ray imaging system, the method comprising:

acquiring a transparency related vector consisting of transparency values of the item to be inspected in N energy regions, wherein N is greater than 2; and determining the item to be inspected based on the transparency related vector, wherein the determining the item to be inspected based on the transparency related vector comprises:

mapping the transparency related vector and transparency related vectors stored in the system consisting of N transparency mean values of multiple kinds of items with multiple thicknesses in the N energy regions into a two-dimensional plane by using a non-linear dimension reduction algorithm, so as to acquire a mapping point of the transparency related vector of the item to be inspected in the two-dimensional plane and a set of mapping points of the transparency related vectors of the multiple kinds of items in the two-dimensional plane, respectively;

determining one of the set of mapping points which is closest to the mapping point; and identifying the item to be inspected as the one of the multiple kinds of items corresponding to the closest point.

4. The method of claim 3, wherein the determining one of the set of mapping points which is closest to the mapping point comprises determining a point which is closest to the mapping point by using the Mahalanobis distance algorithm, the Euclidean distance algorithm, or the Cosine distance algorithm.

5. A method of substance identification of an item to be inspected using a multi-energy-spectrum X-ray imaging system, the method comprising:

acquiring a transparency related vector consisting of transparency values of the item to be inspected in N energy regions, wherein N is greater than 2; and determining the item to be inspected based on the transparency related vector;

wherein the determining the item to be inspected based on the transparency related vector comprises:

selecting one or more of the N energy regions as reference energy regions;

acquiring respective N transparency values of the item to be inspected in the N energy regions based on the transparency related vector;

calculating a reference transparency value based on the transparency values of the item to be inspected in the one or more energy regions which are selected as the reference regions;

calculating a relative mass attenuation coefficient value of the item to be inspected in the N energy regions based on the reference transparency value and the N transparency values;

determining one of the multiple kinds of items having a relative mass attenuation coefficient value closest to the relative mass attenuation coefficient value, and identifying the item to be inspected as the determined item.

6. The method of claim 5, wherein the determining one of the multiple kinds of items having a relative mass attenuation coefficient value closest to the relative mass attenuation coefficient value and the identifying the item to be inspected as the determined item comprises:

determining one of the multiple kinds of items having a relative mass attenuation coefficient value closest to the relative mass attenuation coefficient value by using the minimum mean square error method.

7. The method of claim 5, wherein the determining one of the set of mapping points which is closest to the mapping point comprises determining a point which is closest to the mapping point by using the Mahalanobis distance algorithm, the Euclidean distance algorithm, or the Cosine distance algorithm.

8. A multi-energy-spectrum X-ray imaging system, comprising:

an X-ray source configured to generate an X-ray;

a detector configured to receive the X-ray which is emitted from the X-ray source and is transmitted through or scattered by an item to be inspected and convert the received X-ray into an output signal;

a processor configured to execute program instructions to be operable to acquire, based on the output signal, a transparency related vector consisting of transparency values of the item to be inspected in N energy regions, wherein N is greater than 2; and determine the item to be inspected based on the transparency related vector; and a memory configured to store the program instructions;

wherein the processor is further configured to determine the item to be inspected based on the transparency related vector by:

calculating distances between the transparency related vector and transparency related vectors stored in the system consisting of N transparency mean values of multiple kinds of items with multiple thicknesses in the N energy regions; and determining a first atomic number and a first thickness of the item corresponding to the minimum distance and a second atomic number and a second thickness of an item corresponding to the next minimum distance;

determining an atomic number and a thickness of the item to be inspected by using a linear interpolation algorithm based on the first and second atomic numbers and the first and second thicknesses; and determining a kind of the item to be inspected based on the atomic number and the thickness of the item to be inspected.

9. A multi-energy-spectrum X-ray imaging system, comprising:

an X-ray source configured to generate an X-ray;

a detector configured to receive the X-ray which is emitted from the X-ray source and is transmitted through or scattered by an item to be inspected and convert the received X-ray into an output signal;

a processor configured to execute program instructions to be operable to acquire, based on the output signal, a transparency related vector consisting of transparency values of the item to be inspected in N energy regions, wherein N is greater than 2; and determine the item to be inspected based on the transparency related vector; and a memory configured to store the program instructions, wherein the processor is further configured to determine the item to be inspected based on the transparency related vector by:

mapping the transparency related vector and transparency related vectors stored in the system consisting of N transparency mean values of multiple kinds of items with multiple thicknesses in the N energy regions into a two-dimensional plane by using a non-linear dimension reduction algorithm, so as to acquire a mapping point of the transparency related vector of the item to be inspected in the two-dimensional plane and a set of mapping points of the transparency related vectors of the multiple kinds of items in the two-dimensional plane, respectively;

determining one of the set of mapping points which is closest to the mapping point; and identifying the item to be inspected as the one of the multiple kinds of items corresponding to the closest point.

10. The system of claim 9, wherein the processor is further configured to:

determine a point of the set of mapping points which is closest to the mapping point by using the Mahalanobis distance algorithm, the Euclidean distance algorithm, or the Cosine distance algorithm.

11. A multi-energy-spectrum X-ray imaging system, comprising:

an X-ray source configured to generate an X-ray;

a detector configured to receive the X-ray which is emitted from the X-ray source and is transmitted through or scattered by an item to be inspected and convert the received X-ray into an output signal;

a processor configured to execute program instructions to be operable to acquire, based on the output signal, a transparency related vector consisting of transparency values of the item to be inspected in N energy regions, wherein N is greater than 2; and determine the item to be inspected based on the transparency related vector; and a memory configured to store the program instructions, wherein the processor is further configured to determine the item to be inspected based on the transparency related vector by:

selecting one or more of the N energy regions as reference energy regions;

acquiring respective N transparency values of the item to be inspected in the N energy regions based on the transparency related vector;

calculating a reference transparency value based on the transparency values of the item to be inspected in the one or more energy regions which are selected as the reference regions;

calculating a relative mass attenuation coefficient value of the item to be inspected in the N energy regions based on the reference transparency value and the N transparency values; and determining one of the multiple kinds of items having a relative mass attenuation coefficient value closest to the relative mass attenuation coefficient value, and identifying the item to be inspected as the determined item.

12. The system of claim 11, wherein the processor is further configured to:

determining one of the multiple kinds of items having a relative mass attenuation coefficient value closest to the relative mass attenuation coefficient value by using the minimum mean square error method.

\* \* \* \* \*